US011346989B2

(12) United States Patent
Mulligan et al.

(10) Patent No.: US 11,346,989 B2
(45) Date of Patent: May 31, 2022

(54) MESOGEN POLARIZER

(71) Applicant: Vision Ease, LP, Ramsey, MN (US)

(72) Inventors: James Mulligan, North Yorkshire (GB); Michael Boulineau, Forest Lake, MN (US); Jeffrey Brown, St. Louis Park, MN (US); Jared Johnson, Ramsey, MN (US); Michael Marshall, Andover, MN (US); Sandy Goebel, Stacy, MN (US); Joseph Leaman, Minneapolis, MN (US)

(73) Assignee: HOYA Optical Labs of America, Inc., Lewisville, TX (US)

( * ) Notice: Subject to any disclaimer, the term of this patent is extended or adjusted under 35 U.S.C. 154(b) by 0 days.

(21) Appl. No.: 16/817,398

(22) Filed: Mar. 12, 2020

(65) Prior Publication Data

US 2020/0292740 A1   Sep. 17, 2020

Related U.S. Application Data

(60) Provisional application No. 62/819,377, filed on Mar. 15, 2019.

(51) Int. Cl.
*G02B 5/30* (2006.01)
*C23C 14/34* (2006.01)
*C23C 14/08* (2006.01)
*G02C 7/12* (2006.01)

(52) U.S. Cl.
CPC ............ *G02B 5/3016* (2013.01); *C23C 14/08* (2013.01); *C23C 14/34* (2013.01); *G02C 7/12* (2013.01)

(58) Field of Classification Search
CPC .................................................. G02B 5/3016
See application file for complete search history.

(56) References Cited

U.S. PATENT DOCUMENTS

| 5,136,819 A | 8/1992 | Takagi et al. |
| 2007/0253062 A1 | 11/2007 | Shimoda et al. |
| 2013/0303677 A1* | 11/2013 | Kim ..................... G02B 5/3016 524/508 |

(Continued)

OTHER PUBLICATIONS

Zeiss, "What's the right way to clean and care for your glasses?: Tips to keep them sparkling.," ZEISS: Health + Prevention, https://www.zeiss.com/vision-care/us/better-vision/health-prevention/what-s-the-right-way-to-clean-and-care-for-your-glasses.html; Oct. 20, 2017, 11 pages.

*Primary Examiner* — Edmond C Lau
(74) *Attorney, Agent, or Firm* — Inskeep IP Group, Inc.

(57) ABSTRACT

The present invention relates to a polarization filter for ophthalmic lenses. The polarization filter comprises a mesogen layer coated onto a retardation film, either directly or through an adhesive layer. The present invention further discloses that the polarization filter formed by employing a thin film or sheet, having a defined level of retardation between the light source and the mesogen layer, for example, a cholesteric mesogen layer, the multilayered laminate structure demonstrates linear polarization of the light transmitted through the mesogen laminate structure, and, hence, can be used in ophthalmic lenses, e.g. spectacle or eyeglass lenses. The polarization filter enhances the performance by allowing transmission of the polarization filter closer to the theoretical maximum transmission.

10 Claims, 12 Drawing Sheets

(56) References Cited

U.S. PATENT DOCUMENTS

2018/0067337 A1    3/2018  Brown et al.
2019/0004225 A1*  1/2019  Iijima .................... B32B 27/08
2019/0048237 A1    2/2019  Fan et al.

* cited by examiner

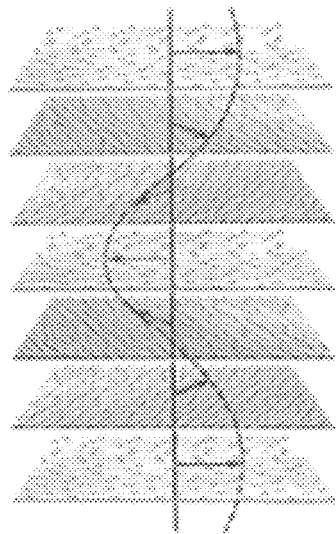 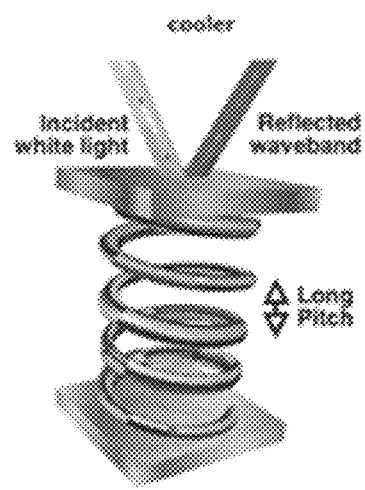 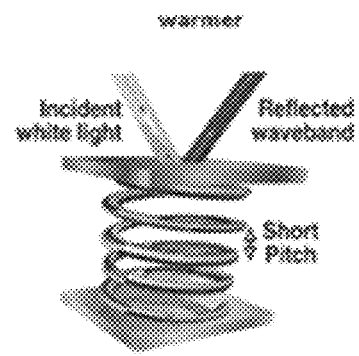
Figure 3A     Figure 3B     Figure 3C
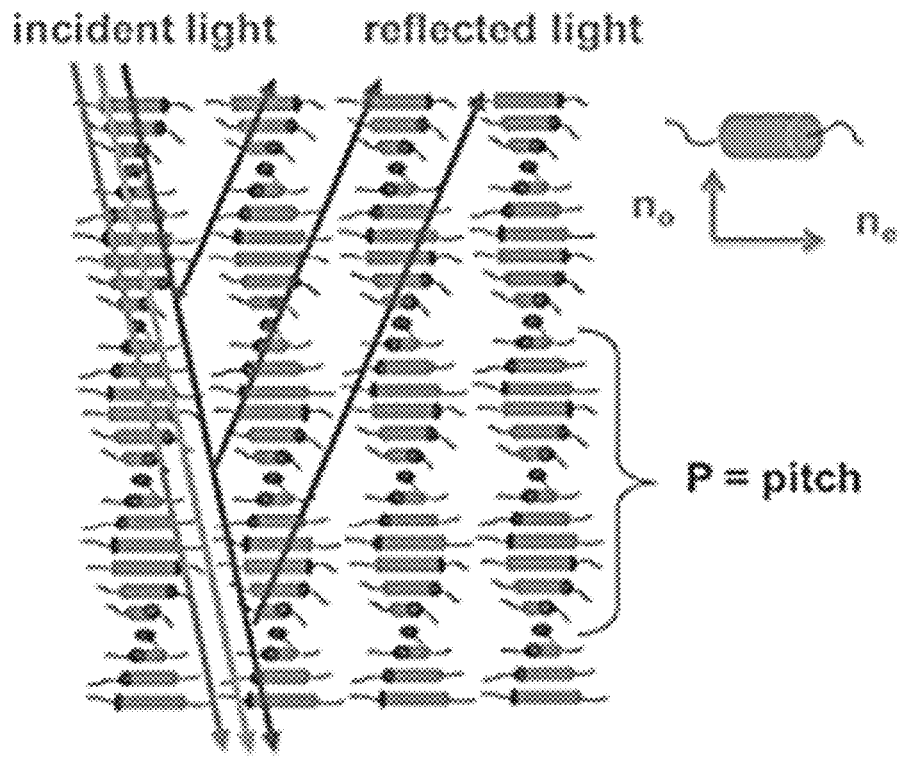
Figure 3D

MESOGEN POLARIZER

RELATED APPLICATIONS

This application claims priority to U.S. Provisional Application Ser. No. 62/819,377 filed Mar. 15, 2019 entitled Mesogen Polarizer, which is hereby incorporated herein by reference in its entirety.

FIELD OF THE INVENTION

The present invention relates to the application of mesogen polarizer for ophthalmic lenses, for example, e.g. spectacle or eyeglass lenses and methods of preparation of the mesogen polarizer.

BACKGROUND OF THE INVENTION

Sunglasses are a ubiquitous outdoor accessory for the majority of Americans and are commonly used worldwide. They can be generally broken into two groups: those that are a purely tinted product and those employing a polarization filter functionality. Tinted products reduce the amount of visible light transmitted to the eye by broad band attenuation of light independent of the polarization of the light. In comparison, polarizing sunglasses employ an additional filtering element that selectively absorbs or reflects light based on polarization of the light. This is advantageous for removing reflected sunlight glare off surfaces such as water, wet roads, and snow. The removal of reflected glare has benefits in terms of comfort of the user but also safety. For example, reflected glare from road surfaces can adversely affect vision, causing drivers to instinctively slow down unexpectedly, increasing the risk of collision from vehicles behind the driver. In addition to the comfort and safety aspect there also exists a significant fashion component to sunglasses. Many users treat sun wear as an accessory which influences the choice of color and transmission level for purely aesthetic reasons.

Current polarizing sunglasses are manufactured from polyvinyl alcohol polarizing filters. A description of manufacturing a PVA polarizing film is provided in WO2008111702A1 and WO1999036814A1, herein incorporated by reference. In such designs the polarizing effect is created by doping the PVA with iodine or a dichroic dye and aligning the dye molecules by stretching the PVA film. Dichroic dyes typically absorb light in the non-transmitting polarization. However, they also absorb some of the light in highly transmitting axes. The result are films that have inherent color that potentially affects the aesthetics of the lens. This is shown schematically in FIG. 1. The polarization efficiency (PE) of the lens is given by the following relationship (per ISO 8980-3:2013(E)):

Equation 1 Polarization Efficiency $$PE = \frac{\tau_H - \tau_O}{\tau_H + \tau_O} \times 100\%$$

Where $\tau_H$ is the maximum luminous transmission and $\tau_O$ is the minimum luminous transmission for light filtered through a linear polarizing filter that is rotated to locate the maximum and minimum luminous transmission states. The PE can also be calculated for a given wavelength by using the maximum and minimum transmissions at that given wavelength. The theoretical maximum transmission for a perfect polarizer (PE=100%) is 50%, i.e. all of the light at the non-transmitting alignment is absorbed or reflected and all of the light in the maximum transmitting alignment is transmitted. An increase in transmission above 50% requires a decrease in the PE, as shown in the right most line of FIG. 1.

To simulate the effect of a non-polarizing dye, calculations were performed for different levels of tint and the different performance curves are shown in FIG. 1. What is meant by the tint is the percent loss in transmission. For example, a 30% tint would mean the lens without any polarizing function would have a maximum transmission of 70%. This can also be thought of as representing the loss due to the dichroic dye absorbing some light in the highly transmitting axis. The performance of many commercially available PVA films are included in FIG. 1.

What becomes apparent is the limitation of performance—the best performing products show the equivalent transmitted loss of a tint greater than 20%. This has implications for the aesthetic of the lens. In order to achieve an arbitrary color, one must first potentially compensate for the residual color due to the polarizing dye or find a dichroic dye that satisfies the desired color requirement. Furthermore, it also impacts what other functionality can be added to the ophthalmic lens, for example a photochromic or electrochromism due to regulatory transmission requirements.

It is therefore desirable to develop alternate polarizers and/or polarizing technology that better decouples the luminous transmission from the PE, allowing performance closer to the theoretical maximum.

OBJECTS AND SUMMARY OF THE INVENTION

The present invention relates to the application of a mesogen polarizer for ophthalmic lenses, for example, e.g. spectacle or eyeglass lenses and methods of preparation of the mesogen polarizer.

In one embodiment, the mesogen polarizer includes a laminate comprising a film having a defined level of retardation; and at least one mesogen layer coated onto said retardation film, wherein said laminate exhibits a polarization efficiency of greater than 50% and a percentage of luminous transmission of greater than 50% in the visible region.

Another embodiment of the present invention includes attaching one mesogen layer to the retardation thin film through an adhesive layer. The adhesive layer includes a urethane adhesive, an acrylate adhesive or an epoxy adhesive with a thickness of the adhesive layer in a range of 0.1 to 5 microns.

A further embodiment is a method of making a mesogen polarizer for ophthalmic lenses. The method includes providing a thin film having a controlled retardation and coating a mesogen layer onto said thin film to form a laminate. The laminate is held in an oven for a period of time and at a range of temperature for annealing. After annealing, the mesogen layer of the laminate is cured by UV radiation.

BRIEF DESCRIPTION OF THE DRAWINGS

These and other aspects, features and advantages of which embodiments of the invention are capable of will be apparent and elucidated from the following description of embodiments of the present invention, reference being made to the accompanying drawings, in which

FIG. 3A-3D illustrate coil shaped or helical cholesteric liquid crystal structures.

DESCRIPTION OF EMBODIMENTS

Figure 1:
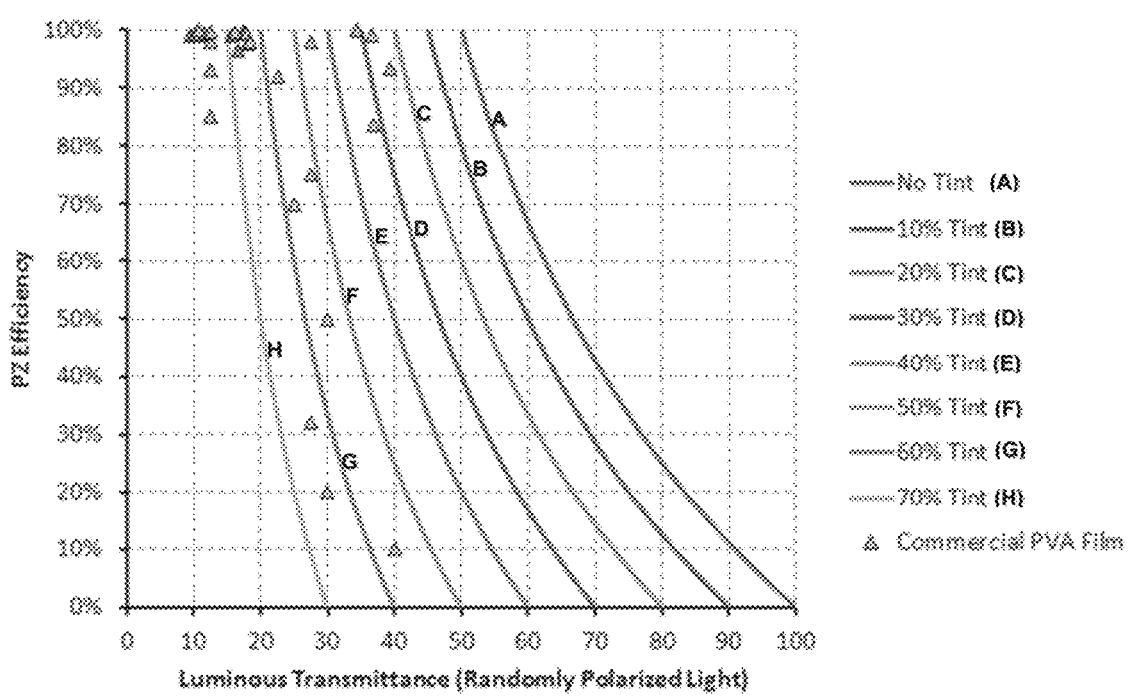
FIG. 1 is a graphical representation of polarization efficiency with respect to transmittance for different levels of tints and many commercially available PVA films.

Specific embodiments of the invention will now be described with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the embodiments illustrated in the accompanying drawings is not intended to be limiting of the invention. In the drawings, like numbers refer to like elements.

Mesogens are molecules that exhibit a meso-phase. They form the functional part of liquid crystals that enable typical liquid crystal behavior, i.e. aligned liquid phases. Reactive mesogens can be cured after alignment which enables the properties of the liquid crystal, such as birefringence, to be preserved.

Figure 2:
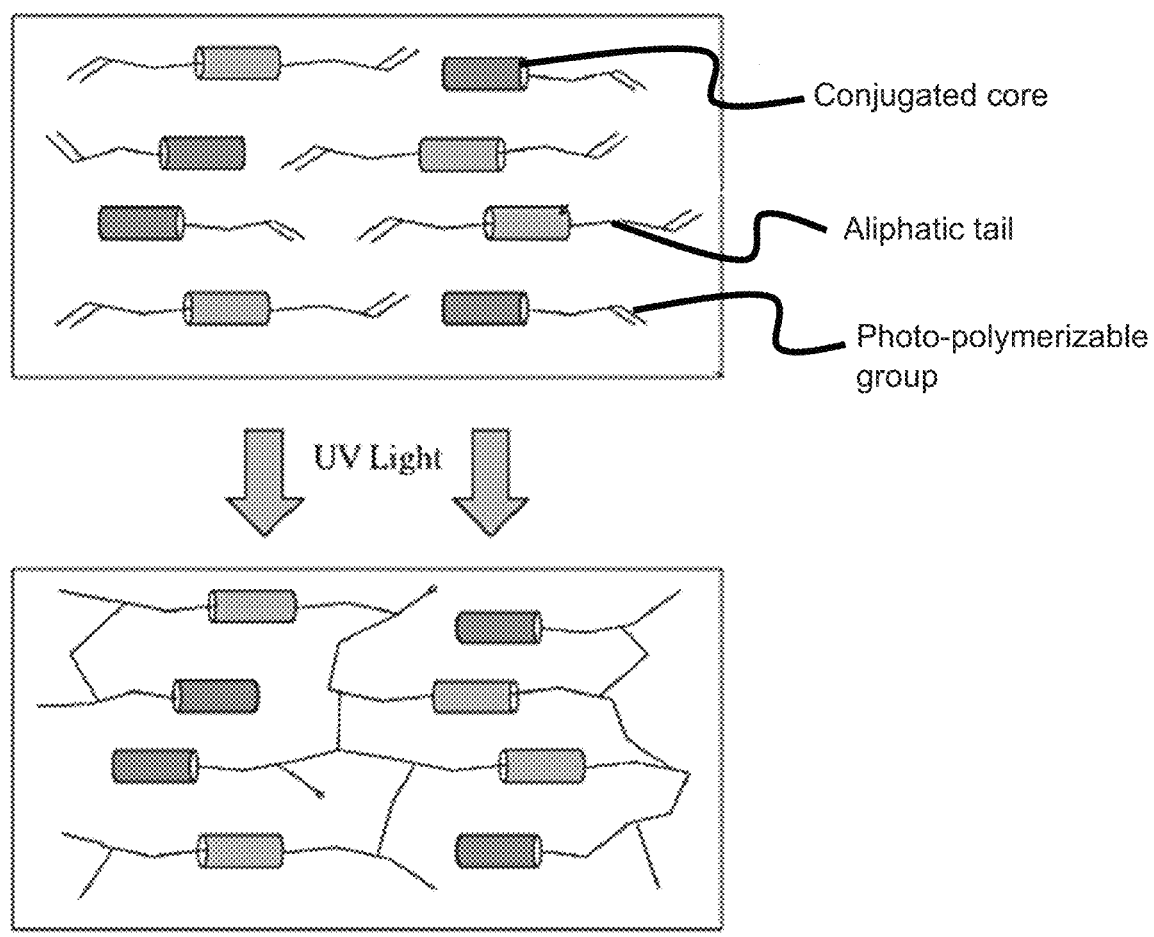
FIG. 2 illustrates the formation of a reactive mesogen layer.

FIG. 2 is a graphical representation of the formation of a reactive mesogen layer. One type of mesogen that has been investigated by the inventors is cholesteric liquid crystal which forms a helical structure. Cholesteric mesogens naturally form a circularly polarizing structure. When this is aligned, there is a selective reflection which can be used as a polarization filter. The degree and wavelength range of the reflection can be tuned to a specific polarization axis. A diagrammatic representation of cholesteric liquid crystal structure is shown in FIG. 3A-3D (sources: hhttp://physics.stackexchange.com/questions/3217/liquid-crystal-polarizes-light-reflection-question; J. Mater. Sci. C, 2014,6695-6705).

It has been found that by employing a material layer, such as a thin film or sheet, having a defined level of retardation between the light source or incoming light and the mesogen layer, for example, a cholesteric mesogen layer, the multi-layered laminate structure demonstrates functionality of a linear polarizer, and, hence, can be used in ophthalmic lenses, e.g. spectacle or eyeglass lenses.

Figure 4A:
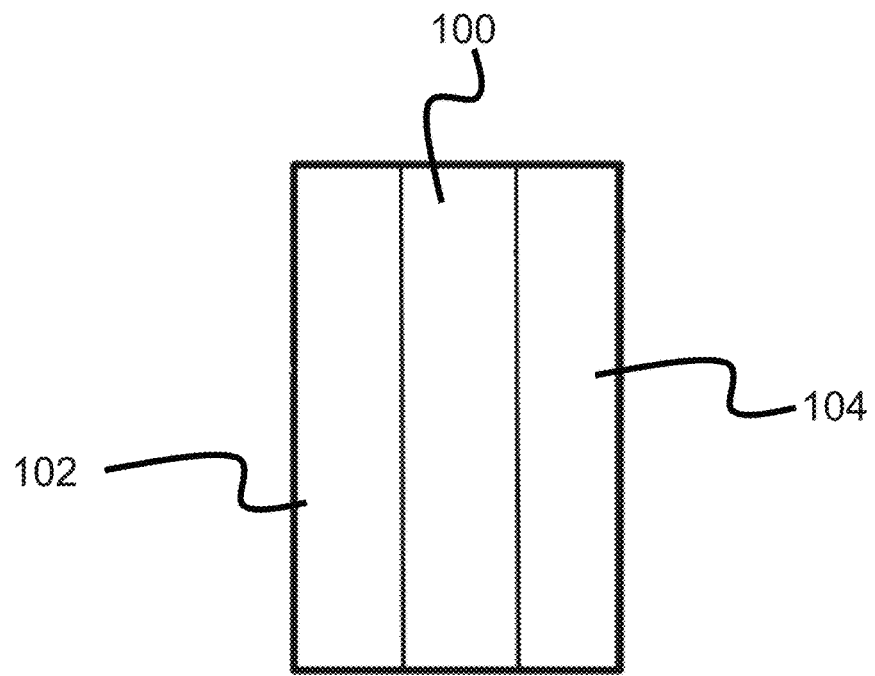
FIG. 4A illustrates a laminate structure formed of a mesogen layer attached to a thin film having a defined level of retardation and an optional second retardation thin film.

Accordingly, as shown in FIG. 4A, in one embodiment of the present invention, a linear polarizing element formed of a mesogen layer 100 attached to a thin film 102 having a defined level of retardation is provided. For the sake of clarity, the thin film 102 having a defined level of retardation will be referred to as a controlled retardation layer 102 and the combined mesogen layer 100 and controlled retardation layer 102 will be referred to as a laminate structure. The mesogen layer 100 can be attached directly to the controlled retardation layer 102 or indirectly to the controlled retardation layer 102, e.g. through the use of an adhesion layer 108. Exemplary adhesives include, but are not limited to, urethane, acrylate, epoxy or other adhesive chemistries. The adhesive should bond well to adjacent layers, as well as be capable of being formed into specific geometries for lens manufacture. In some embodiments, a thickness of the adhesive layer 108 is in a range of about 5-40 μm. In some embodiments, a thickness of the mesogen layer 100 is about 2-3 μm. In some embodiments, a thickness of the controlled retardation layer 102 is about 25-380 μm.

In certain embodiments of the present invention, a linear polarizing element is formed of a mesogen layer 100 interposed between two controlled retardation layers 102 and 104. The two opposing controlled retardation layers 102 and 104 can be formed of identical controlled retardation layers or formed of dissimilar controlled retardation layers.

Figure 4B:
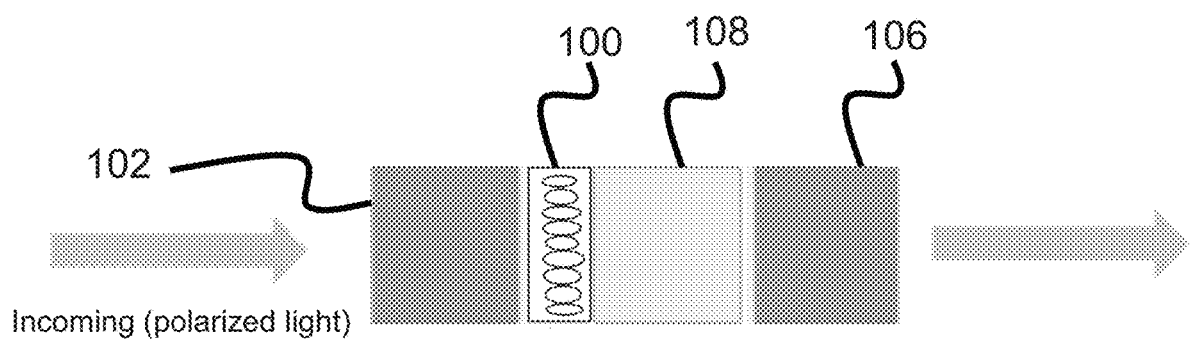
FIG. 4B illustrates a laminate structure having a mesogen layer attached to a protective or support layer through an adhesive layer at one end and the mesogen layer attached to a controlled retardation layer at the other end.
Figure 4C:
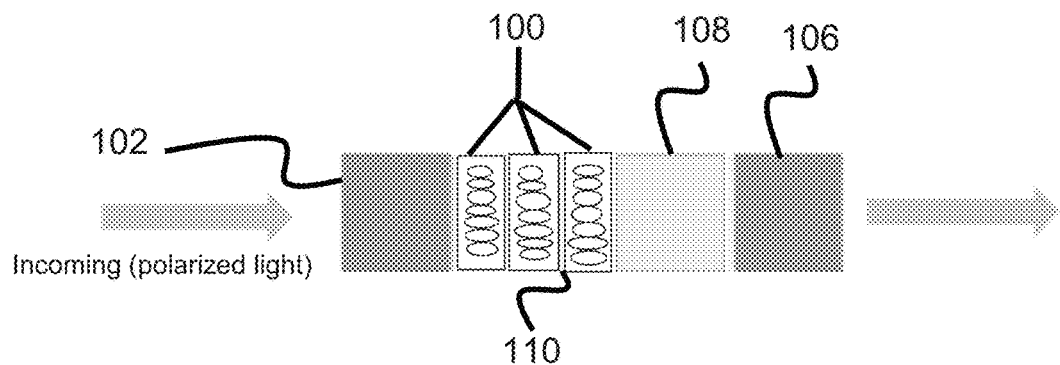
FIG. 4C illustrates multiple mesogen layers attached with optional interstitial layer(s) to each other and the multiple mesogen layers are attached to a protective or support layer through an adhesive layer at one end and a controlled retardation layer at the other end.

In certain embodiments of the present invention, as shown in FIGS. 4B and 4C, the polarizing element further includes a support or protective thin film or sheet 106 attached to a side of the mesogen layer 100 opposite the controlled retardation layer 102. For the sake of clarity, this supporting or protective film will be referred to as a support layer 106 and the overall structure employing such will be referred to as a laminate structure. The mesogen layer 100 can be attached directly or indirectly, e.g. through the use of an adhesion layer 108 to the support layer 106. The support layer 106 may, for example, be formed of polycarbonate, polyvinyl alcohol, PVA, or other transparent optical quality material. In some embodiments, a thickness of the support layer 106 is about 50-380 μm.

In certain embodiments, as described further below and shown in FIG. 4C, the polarizing element of the present invention employs multiple mesogen layers with optional interstitial layer(s) 110.

MESOGEN TECHNOLOGY

In certain embodiments of the present invention, commercially available mesogen solutions, e.g. Licrivue RMS11-066, RMS11-068 & RMS09-032 (supplied by EMD Performance Materials) are employed to form various linear polarizing elements.

For example, in certain embodiment of the present invention, a mesogen solution comprising of Licrivue RMS11-086 supplied in a 40 solids percent toluene solution (EMD Performance Materials) was employed to coat various types of substrates. Licrivue RMS11-086 is formed of a composition including:

(1) 50-70% toluene;

(2) 10-30% APBMP-1,4-Bis-[4-(3-acryloyloxypropyloxy)benzoyloxy]-2-methylbenzene (synonyms: 1,4-Bis-[4-(3-acryloyloxypropyloxy)benzoyloxy]-2-methylbenzene) having the formula:

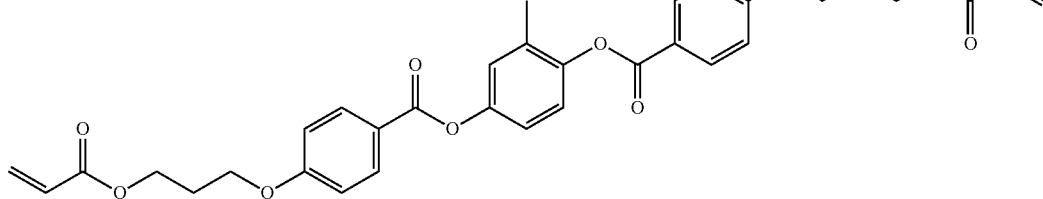

(3) 5-10% AHBPCHP-4-(6-Acryloyloxyhexyloxy)-benzoesure (4-(trans-4-propylcyclohexyl)-phenylester) having the formula:

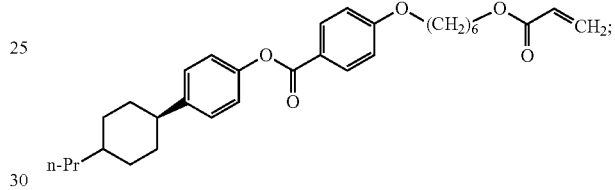

(4) 5-10% AHBMP-4-[[6-[(1-Oxo-2-propenyl)oxy]hexyl]oxy]benzoic acid 4-methoxyphenyl ester having the formula:

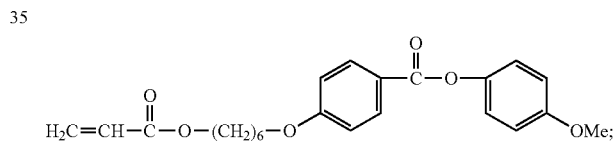

(5) 5-10% AHBCP-Cyanophenyl 4'-(6-acryloyloxyhexyloxy)benzoate having the formula:

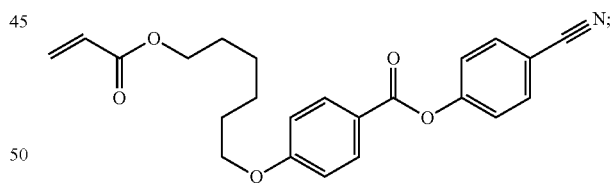

(6) 1-5% MPBIS[AHB]-1,4-BIS-[4-(6-ACRYLOYLOXYHEXYLOXY)BENZOYLOXY]-2-METHYLBENZENE having the formula:

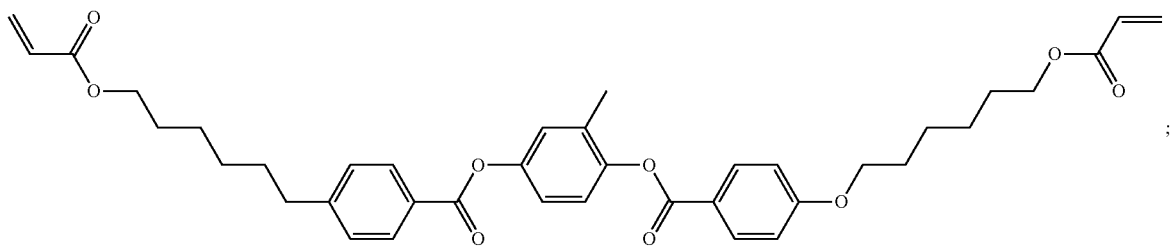 [SMILES: C=CC(=O)OCCCCCCOc1ccc(C(=O)Oc2ccc(OC(=O)c3ccc(CCCCCCOC(=O)C=C)cc3)cc2C)cc1]

(7) 1-5% 2-ethyl-4'-(methylthio)-2-morpholinopropiophenone having the formula:

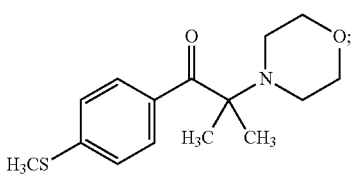

and (8) 1-5% (13bS)-5,6-dihydro-4H-naphthol[2,1-f:1',2'-h][1,5]dioxonin-5-yl-4 acryloyloxy biphenyl-4-carboxylate.

Additional exemplary reactive mesogen materials are described in U.S. Pub. Nos. 2018/0134959 and 2018/0163137 and International Pub. Nos. WO 2018099879 and WO 2018073159, the contents of which are herein incorporated in their entireties by reference.

PREPARATION OF MESOGEN POLARIZER

Figure 5:
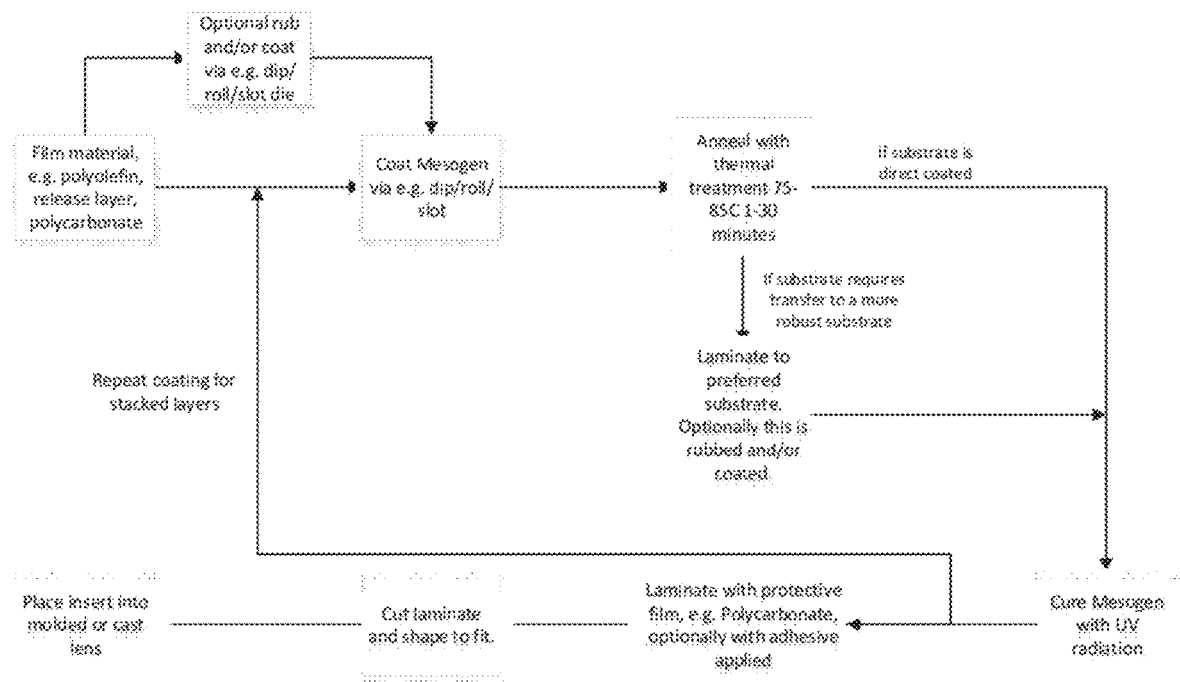
FIG. 5 illustrates a method of preparing the mesogen polarizer laminate.

With reference to FIG. 5, exemplary methods of preparing the mesogen polarizer are described below. These methods employed the EMD/Merck mesogens. It should be understood that different reactive Mesogens may require different preparation methods. The below is provided for illustrative purposes and not by way of limitation.

A. Controlled Retardation Layer Preparation.

Various controlled retardation layers tested including biaxially oriented polypropylene (BOPP) such as TX-G available from Toray, polycarbonate such as Panlite PC-1151 from Teijin, and cyclic olefin co-polymer (COC) from LOFO.

In order for the controlled retardation layers to act as a retardation layer it needs to have a retardation in the range of 50-260 nm with a target of 147 nm (as measured at 590 nm). It is also desired to have an engineered retardation across the visible spectrum, nominally 380-780 nm. Such design of retardation in the film controls the phase shift between the fast and slow polarizing axis which in turn provides control over the resulting polarized state of light exiting the retarding film, i.e. by allowing conversion of the linearly polarized light to circularly polarized light. This improves performance over the visible spectrum.

The controlled retardation layers can be optionally coated with chemical treatments such as polyurethane dispersion, sol-gel coatings etc. Thickness of which will typically be in the range from 0.1 to 5 microns.

The controlled retardation layers can be optionally treated with plasma or corona discharge.

Good mesogen alignment occurs by rubbing the surface of the controlled retardation layers, using a clean room woven cloth, such as Alpha wipe TX1009 available from Texwipe. The applied force of rubbing to give good alignment was found to be 0.01 to 0.1 g/sq cm. Rubbing can be carried out in any direction and the optimal number of rubs was between 5 and 100.

Good alignment also is obtained on polycarbonate film coated with, for example, polyurethane dispersion or silanes, via dip or rod coating. Thickness of the coating used varied between 100 nm and 3 microns. Thinner inorganic coatings, such as silica, zirconia, in the range of 10 to 50 nm can also be used as means of promoting alignment.

Delicate controlled retardation layers can be used by coating and aligning the mesogen material and transferring this mesogen coating to a more robust film before curing. In this configuration the restriction on retardation levels applies to the film the mesogen layer is being transferred to.

Alternative alignment mechanisms include nip coating and plasma treatment. Optionally the surface energy of the substrate can be adjusted by methods such as corona discharge or plasma treatment.

b) Coating

There are a number of ways of forming the Mesogen layer:

Spin coating: Approximately 1 ml of mesogen solution is applied to a substrate. A spin regime of between 100 and 2000 rpm is applied for a period between 10 and 180 seconds. Optionally, the substrate can be spinning at the time of addition of the solution.

Bar coating: Coating bars or wire wound rods can be used to meter the coating over the surface of a substrate.

Slot die coating: In this technique coating fluid is metered out through a die of precise geometry.

Roll coating via a laminating nip roll: The solution is metered out in-between two films or sheets.

Spray coating: In this technique the mesogen solution is sprayed onto a substrate surface.

As shown in FIG. 4C, mesogen layers can be stacked in multiple layers. This is achieved by initially coating the mesogen via, for example, spin coating, bar coating etc. After the layer is cured another mesogen layer is coated on the mesogen coating. After coating the mesogen layer can be annealed and cured before optionally adding further layers. It is possible to add treatments, such as corona discharge, plasma, or intermediate layers such as urethane adhesive(s) between the stacked mesogens.

c) Annealing

After applying the mesogen layer, the layer is held for a period of 30 seconds to 30 minutes to enable the removal of the volatile component(s) (e.g. solvent). After this period the mesogen layer is placed in an air-controlled oven. Annealing temperatures between 75 degrees to 95 degrees Celsius for at least 45 seconds (30 seconds to 10 minutes) were observed as producing good alignment.

d) Lamination.

After the mesogen layer is annealed, it can be transferred to another film material which is optionally coated with a material to aid transfer, e.g. a primer, adhesive material.

The film with a mesogen layer can be laminated in a construction that serves to protect this coated surface. The protective film will typically be a film of low retardation value.

e) Curing

The curing of the mesogen layer is achieved by exposing to UV radiation. A level of UV radiation of at least 25 mW/sq cm for at least 1 minute is required. Optionally a nitrogen blanket may be used during the UV curing process. For example, the mesogen formula provided by EMD has monomers with acrylate functionality and initiators that enable crosslinking.

f) Miscellaneous Considerations

The laminate construction can enable combined functionality along with a polarization medium. Dyes that can act in a photochromic, UV or blue blocking or colorant can be incorporated into the protective film, adhesive layers or lens material.

Example 1

Demonstration of fine tuning of retardation: (JL0172-3).

Support Layer—flat molded polycarbonate lenses of thickness between 0.25 and 3 mm.

Optionally a silica surface layer is applied, with a thickness between 20 and 400 nm applied by sputter coating.

Spin coated Licrivue RMS09-032 0.5 ml.

Annealed at 85 degrees Celsius for 1 minute.

UV cured at 25 mw/sq cm for 1 minute with nitrogen blanket.

Controlled retardation layer applied to the mesogen surface by means of a 37-micron thick optical polyurethane adhesive, (e.g. as described in U.S. patent application Ser. No. 16/101,368, herein incorporated by reference).

Spectra were measured using a Perkin Elmer PE-1050 spectrometer. The various curves in the plots indicate different angles of polarization of the light reaching the mesogen sample under test, relative to the alignment direction of the mesogen. The incoming light was passed through a polarization filter (Glann-Taylor Polarizer Crystal supplied by Perkin Elmer) and the Polarization Efficiency was calculated from Equation 1. The sample was set so that the incoming polarized light passed through the retarding film, then through the Mesogen layer and the supporting layer or substrate.

Figure 6:
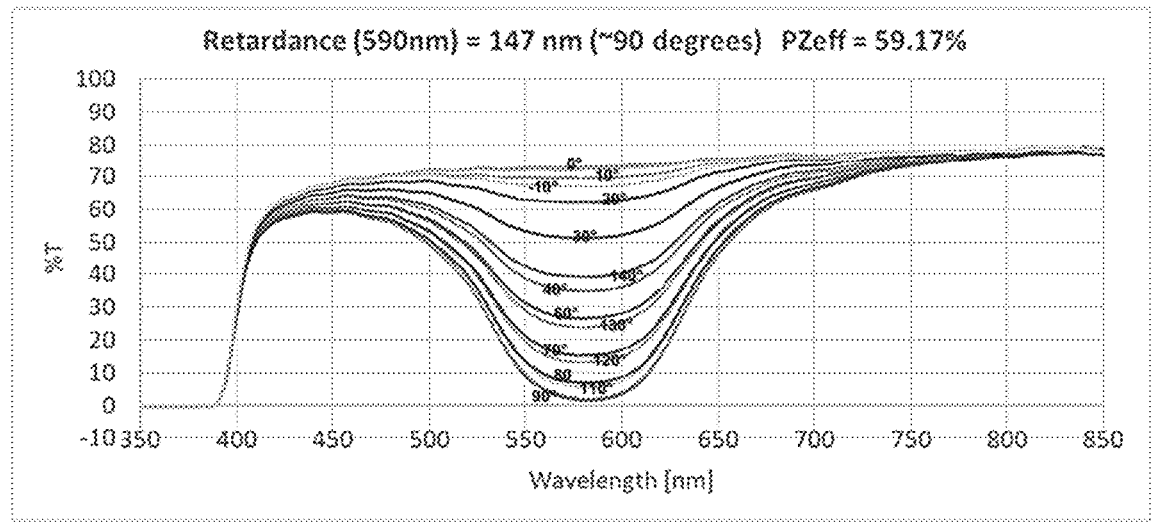
FIG. 6 is a transmission spectrum of a mesogen laminate illustrating transmission curves at approximately 90 degrees polarization angle of incoming light.

Polarization efficiency plots demonstrating transmission curves at with the polarization angle 90 degrees of incoming light being adjusted are shown in FIG. 6. In FIG. 6, the polarization angles of the spectrum of the incident light are shown.

Example 2

The retardation of the polycarbonate sheets was adjusted by stretching under tension at 145 degrees Celsius.

Support Layer—flat molded polycarbonate lenses of thickness between 0.25 and 3 mm.

TABLE 1

Comparison of retardation of laminating film to polarization efficiency

| Sample | Extension | Retardation (nm) | PZ efficiency |
|---|---|---|---|
| Scotch Tape 600 | — | 54 | 26.82% |
| RM 147 ex Teijin |  | 148 | 59.17% |
| Stretched Polycarbonate 1 | 0.00% | 184 | 49.80% |
| Stretched Polycarbonate 2 | 0.00% | 230 | 26.49% |
| Stretched Polycarbonate 3 | 0.00% | 266 | 45.37% |
| Stretched Polycarbonate 4 | 4.99% | 784 | 26.90% |
| Stretched Polycarbonate 5 | 11.55% | 1228 | 24.34% |
| Stretched Polycarbonate 6 | 28.61% | 1425 | −1.88% |

While not wanting to be bound by theory it is assumed that the retarding film converts the linearly polarized light to circular polarized light, optimally near 147 nm retardation. The circular polarized light is either reflected by the mesogen or passes through the mesogen depending on the angle of the retarding layer relative to the polarization state of the incoming light. The control of reflected (i.e. polarized) glare is accomplished by alignment of the retarding direction of the film relative to the polarization state of the light associated with the glare.

For the remainder of the examples we will demonstrate samples consisting of mesogen coated onto a controlled retardation layer. These were examined by directing light through the retarding film and the mesogen and then to a detector. These systems would act in the same manner if a thicker layer after the mesogen was present. This thicker layer is representative of a lens blank with the retarding film and mesogen coating acting as a polarization filter.

Example 3

Demonstration that a single polycarbonate-controlled retardation layer coated with mesogen acts like the construction in Example 1.

A 50-micron polycarbonate (RM147) obtained from Teijin was used.

Spin coat PUD (PU400 ex Stahl Polymers).

Dry at 80 degrees Celsius for 60 minutes.

Spin coated Licrivue RMS09-032 0.5 ml.

Annealed at 85 degrees Celsius for 1 minute.

UV cured at 25 mw/sq cm for 1 min under nitrogen blanket.

Figure 7:
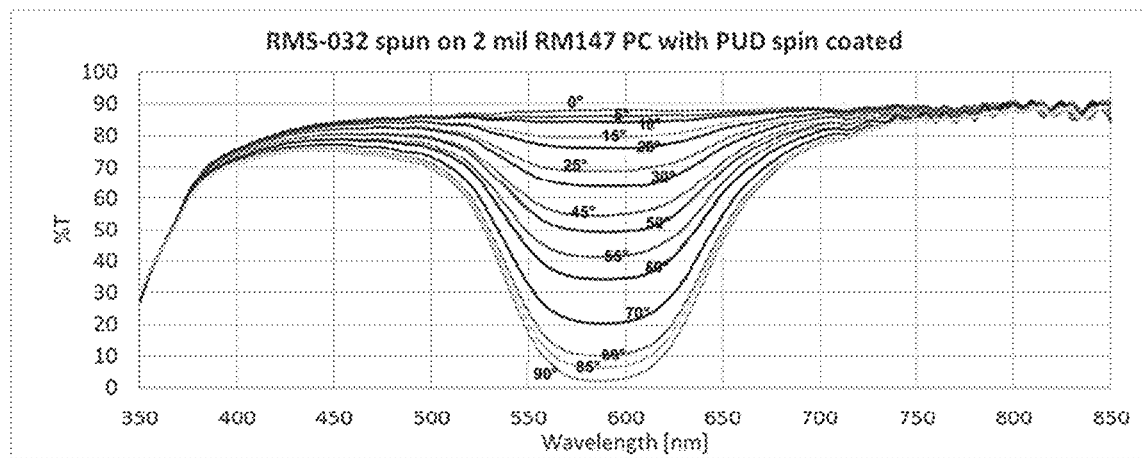
FIG. 7 is a transmission spectrum of a polycarbonate-controlled retardation layer coated with PUD and mesogen.

Spectrum for polycarbonate-controlled retardation layer coated with mesogen are shown in FIG. 7. Note, light must travel through the retardation controlled RM147 polycarbonate film first and then mesogen.

Samples were then laminated to a thicker polycarbonate supporting layer (0.30 mm Teijin Panlite 1151) using a 25-micron polyurethane adhesive layer. (Note this adhesive is the same as that referenced above).

Figure 8:
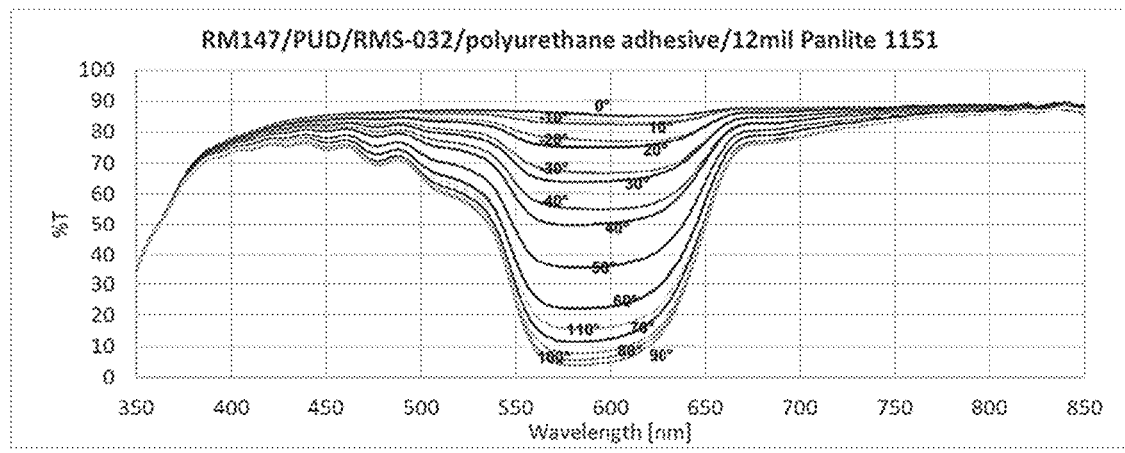
FIG. 8 is a transmission spectrum of a polycarbonate-controlled retardation layer coated with mesogen laminated to thicker polycarbonate supporting layer.

Spectrum for polycarbonate-controlled retardation layer coated with mesogen laminated to thicker polycarbonate supporting layer are shown in FIG. 8. Note light must travel through polycarbonate-controlled retardation layer first and then mesogen layer.

Example 4

Demonstration of the importance of alignments:

Rubbing:

JJ7_5_17-4 PZ Eff 75.1% @620 nm

JJ7_6_17-1 PZ Eff 19.7% @620 nm

Polyolefin controlled retardation layers (BOPP film Treax.TX-G 50 microns) were coated with RMS11-068 spin coating. Dried & annealed 75 degrees Celsius for 1 minute & UV cured 25 mW/sq cm for 1 minute.

First sample, JJ7_5_17-4, was rubbed with Alpha wipe TX1009 100 times, and the second sample, JJ7_6_17-1, was not rubbed.

The rubbing experiment undoubtedly proves that the polarization efficiency significantly increases when the mesogen laminate JJ7_5_17-4 is rubbed with Alpha wipe TX1009 for 100 times in comparison to the mesogen laminate JJ7_6_17-1 which was not rubbed.

Coating PC:

JJ7_5_17-1 PZ Eff~0.0% @620 nm

JJ7_12_17-6 PZ Eff 63.6% @620 nm

The first sample, JJ7_5_17-1, controlled retardation layer was 12 mil Panlite 1151 and uncoated.

The second sample, JJ7_12_17-6, controlled retardation layer was Panlite 1151 and coated with 0.2 microns of PU 400, a polyurethane dispersion from Stahl Polymers.

Both samples were coated with mesogen RMS11-068, annealed and cured as the previous example.

The coating experiment proves that the polarization efficiency of the mesogen laminate, JJ7_12_17-6, significantly increases when the retardation layer, Panlite 1151, was coated with 0.2 microns of PU 400.

Example 5

Demonstration of a transferred mesogen coating (JJ8717-5).

A BOPP film was spin coated with RMS11-068 in the same manner as example 1. It was then annealed again in the manner of example 1. At this stage it was laminated to a 300 micron polycarbonate retardation layer (Panlite PC 1151 ex Teijin).

A second annealing was carried out with the laminate structure.

A UV cure was carried out using 50 mW/sq cm for 1 minute.

The BOPP was removed leaving a mesogen layer on polycarbonate.

Figure 9:
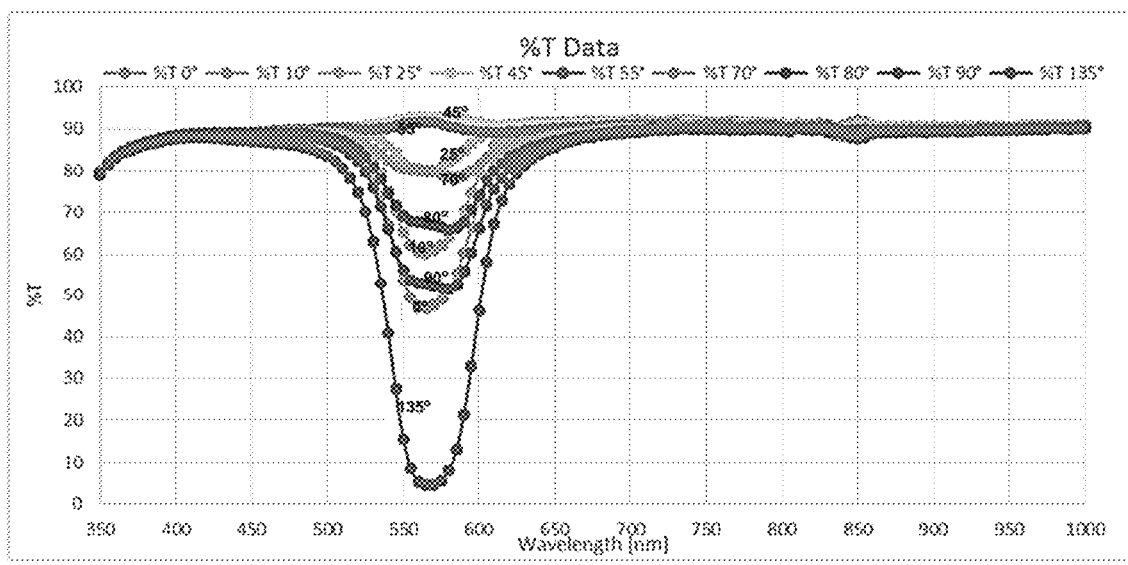
FIG. 9 illustrates percent transmission data for a transferred mesogen coated laminate (JJ8717-1) at different polarization angles of orientation.

FIG. 9 shows the percent transmission data for JJ8717-1 at different polarization angles of orientation.

Example 6

Demonstration of mesogen coated via laminating nip roll.
RMS11-068 applied to polycarbonate-controlled retardation layer previously coated with a polyurethane dispersion, (for example PU-400 from Stahl) at a thickness of 0.2 microns. After leaving for 10 minutes at ambient temperature to dry the solvent the film was laminated to another coated polycarbonate. The lamination roller was heated to 85 degrees Celsius.

Figure 10:
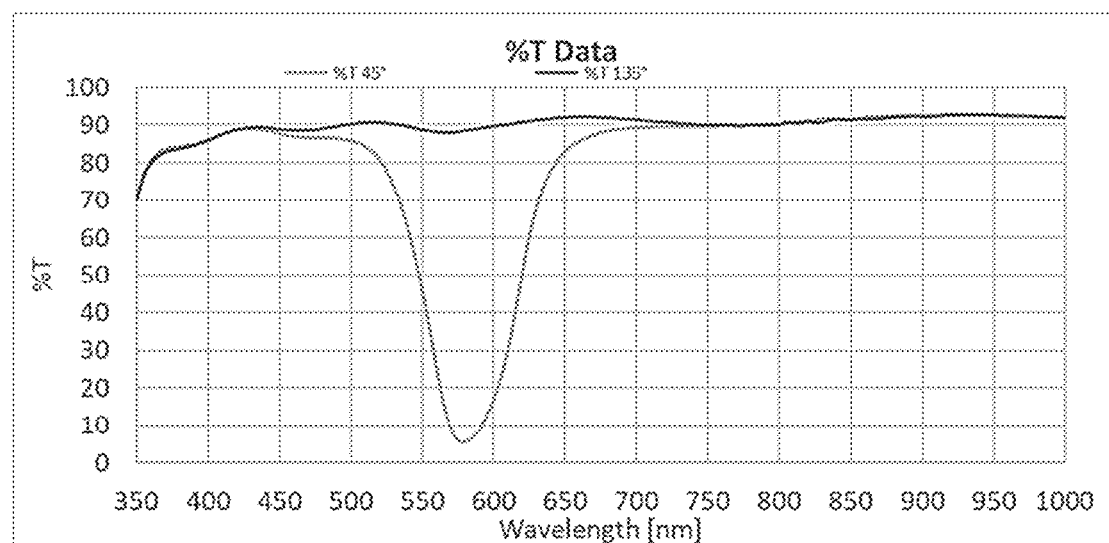
FIG. 10 illustrates percent transmission data for a mesogen coated via laminating nip roll.
Figure 11A:
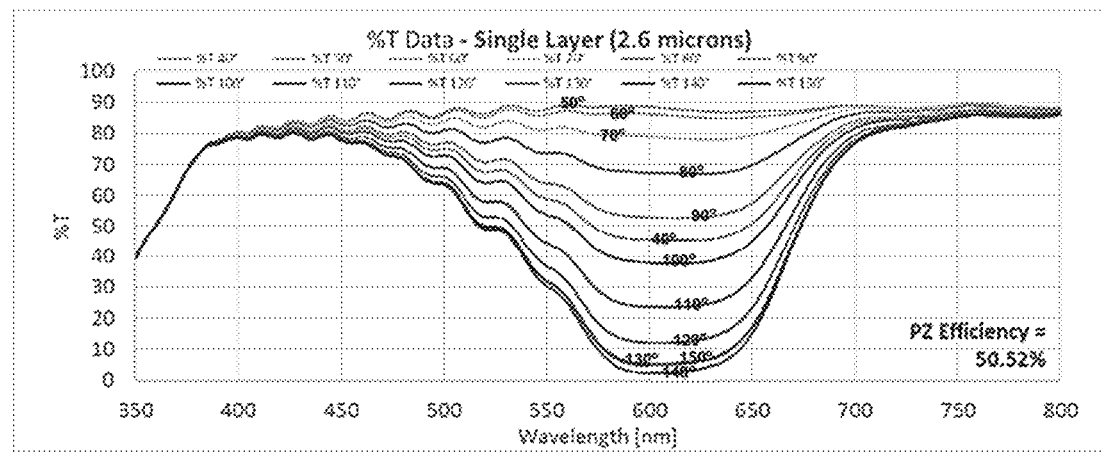
FIG. 11A illustrates percent transmission data for a single layer mesogen laminate.
Figure 11B:
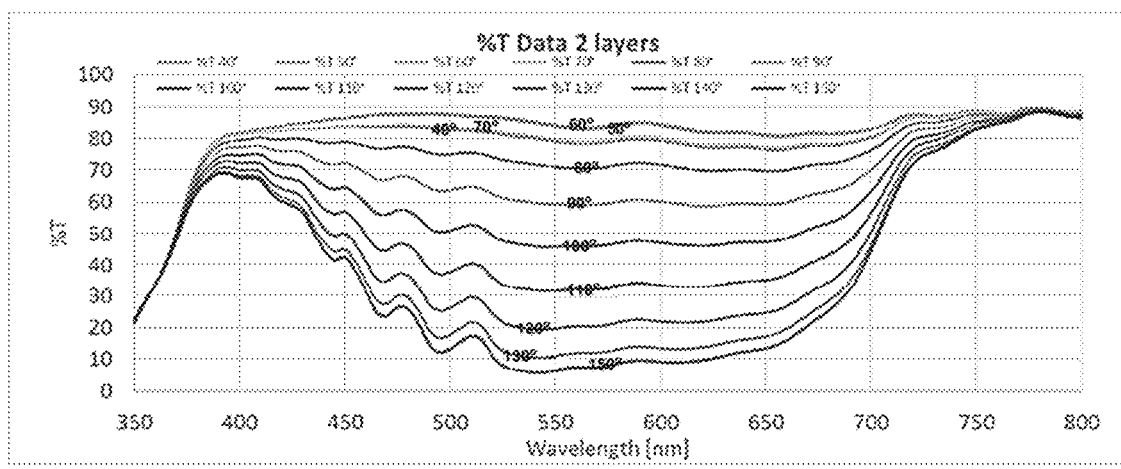
FIG. 11B illustrates percent transmission data for a double layers mesogen laminate.
Figure 11C:
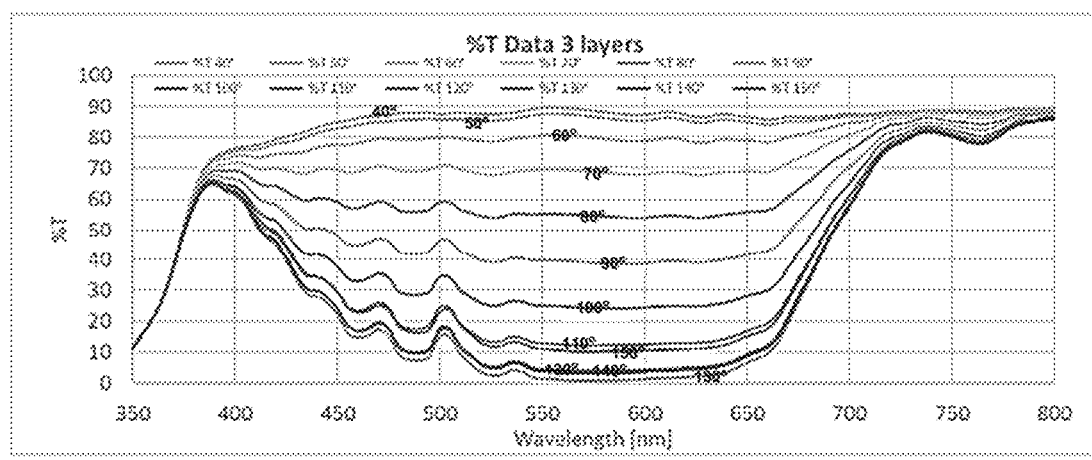
FIG. 11C illustrates percent transmission data for a triple layers mesogen laminate.
Figure 11D:
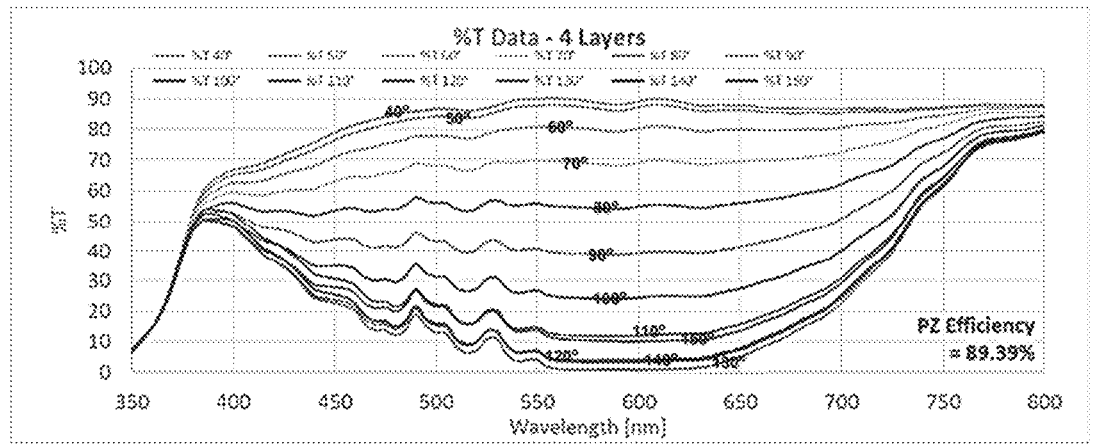
FIG. 11D illustrates percent transmission data for a quadruple layers mesogen laminate.

FIG. 10 shows the percent transmission data for Example 6.

Example 7

Stacked Mesogen Coatings
Polycarbonate-controlled retardation layer Panlite PC-1151 dip coated with PU400 (200 nm thickness).
Spin coated Licrivue RMS09-032 0.5 ml.
Annealed at 85 degrees Celsius for 1 minute.
UV cured at 25 mw/sq cm for 1 min with nitrogen blanket.
FIGS. 11A-11D show spectra for successively stacked spin coated mesogen on polycarbonate-controlled retardation layers. The sample of FIG. 11A employs one mesogen layer. The sample of FIG. 11B employs two mesogen layers. The sample of FIG. 11C employs three mesogen layers. The sample of FIG. 11D employs four mesogen layers.

TABLE 2

Comparison of number of mesogen stacks to polarization efficiency

| No of Stacks | PZ Efficiency avg (380-780 nm) | λ PZ Efficiency max | width @ 50% max |
|---|---|---|---|
| 1 | 50.52% | 605 | 115 |
| 2 | 78.98% | 540 | 235 |
| 3 | 91.75% | 570 | 240 |
| 4 | 89.39% | 580 | 270 |

An alternative method of producing stacked mesogen layered polarizing elements consists of adding interstitial layers of materials such as a polyurethane dispersion at a thickness between 0.1 and 1 micron between adjacent mesogens layers. Another alternative is plasma or corona treatments.

Figure 12:
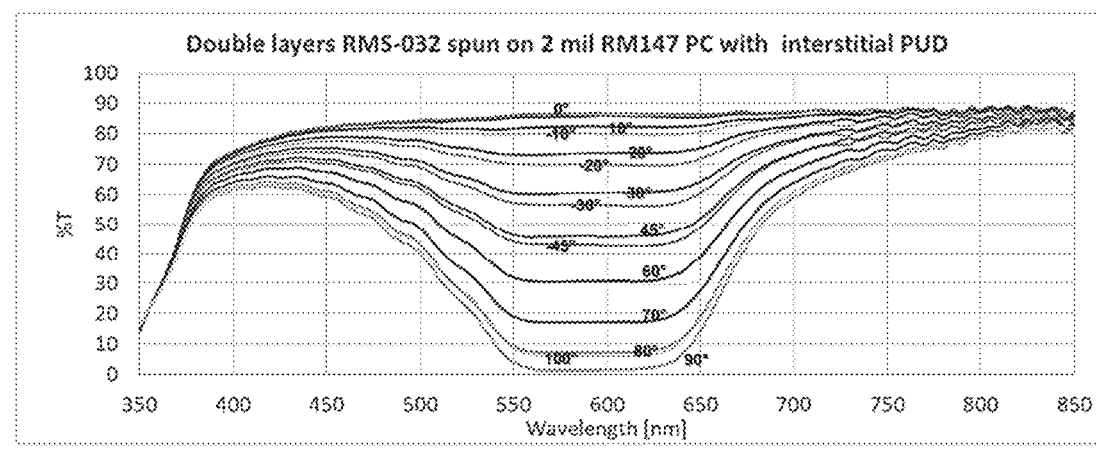
FIG. 12. Illustrates percent transmission data for a mesogen laminate with interstitial layers of materials such as a polyurethane dispersion between adjacent mesogens layers.

As shown in FIG. 12, the application of the interstitial layer enhances the coated appearance and the evenness of the coating color. These results further demonstrate that stacking mesogens coatings enhances the breadth of the reflectance signal. The values of polarization efficiency demonstrated in this example are similar to commercially available polarized lenses.

Example 8

Blending mesogen Coatings.
All mesogens spin coated on coated polycarbonate, annealed and UV cured as per Example 6.

Blended mesogen solution 50:50 by weight blend of RMS09-032 & RMS11-066. 0.5 ml of blend added at spin coating.

Figure 13A:
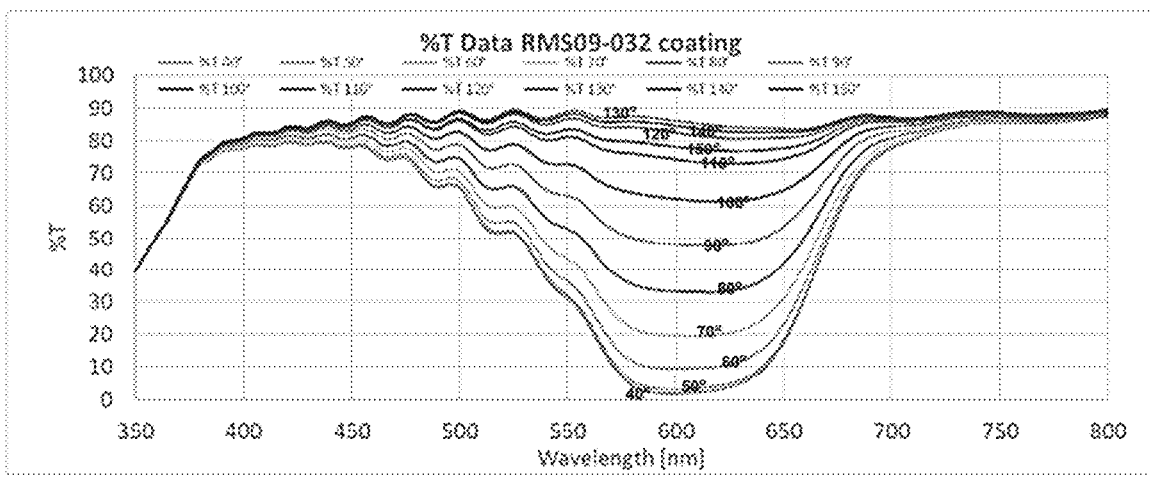
FIG. 13A illustrates percent transmission data for an unblended mesogen, RMS09-032, spin coated on a polycarbonate-controlled retardation layer.
Figure 13B:
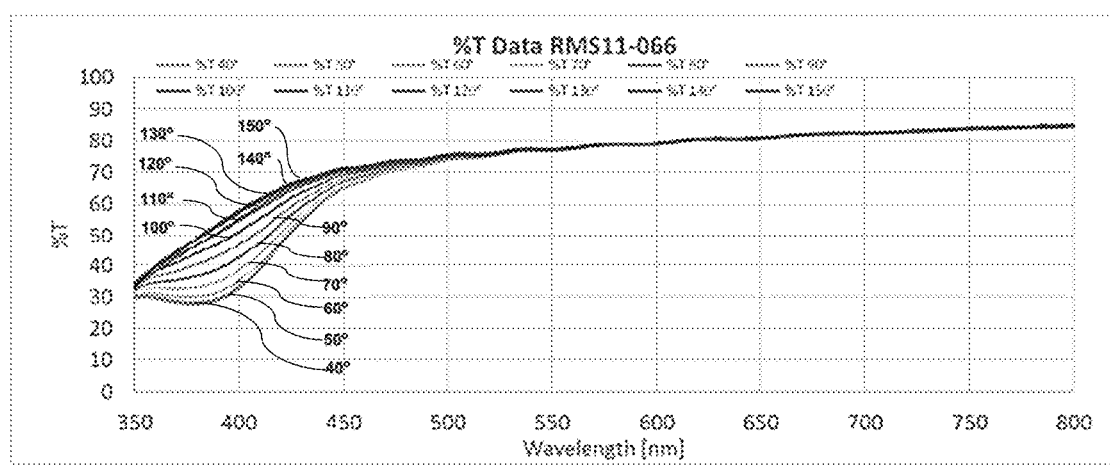
FIG. 13B illustrates percent transmission data for an unblended mesogen, RMS11-066, spin coated on a polycarbonate-controlled retardation layer.
Figure 13C:
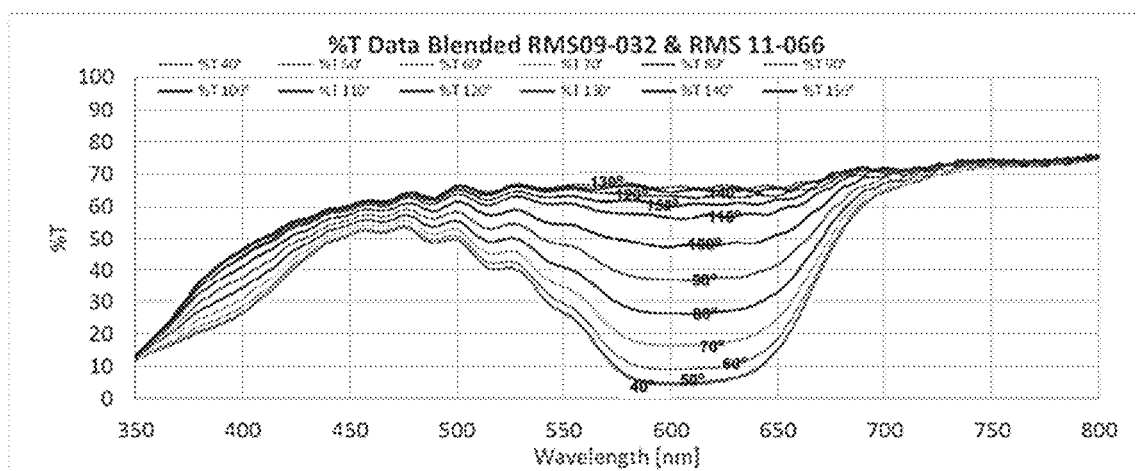
FIG. 13C illustrates percent transmission data for a 50:50 blend of RMS09-032 and RMS11-066 mesogens spin coated on a polycarbonate-controlled retardation layer.

FIGS. 13A-13C are spectra for unblended, RMS09-032 (FIG. 13A); unblended RMS11-066 (FIG. 13B); and 50:50 percent blend of RMS09-032 and RMS11-066 (FIG. 13C) spin coated mesogen on a polycarbonate-controlled retardation layer.

Results demonstrate that blended mesogens can yield the performance of each of the individual components.

The performance of this example may be of use for specialized lenses such as fishing lenses.

The present invention provides, in part:

The use of circular polarizer filters for ophthalmic lenses.
Enabling this technology by using controlled retardation films that are different to previously described examples of ophthalmic polarizing elements.

Controlling the polarization efficiency by using stacked mesogen layers which enables high transmission with good polarization efficiency.

Controlling the wavelength range of the visible region where the polarizing element functions which enables novel polarized lenses for selective glare reduction at particular color regions.

Forming a polarizing element by laminating a mesogen coating between two films where one of these is a retardation film.

Creating a polarizing element by aligning a mesogen coating on one, sacrificial, substrate and then transferring this to another substrate that is more appropriate for processing into a lens structure.

Simplifying the creation of polarizing elements which use roll to roll manufacturing without the requirement for the controlled absorption of dyes and/or the stretching with controlled dimensionally stability.

The use of the retardation layer enables constructions without an alignment layer generated, for example via a rubbing process, which would also simplify scalability.

The application of mesogens in a laminate form also facilitates electrochromic devices by use of transparent conductive films in the laminate construction.

Roll-to-Roll techniques to apply rub (from roughened ceramic cylinders for example), to apply mesogen by slot die or roll coating, and to use nip coating/lamination as an alignment process.

Stacked mesogen layers operable to tune and broaden the range of electromagnetic radiation (light) that is polarized.

Polarizing elements that polarizes different parts of the visible spectrum can be selected as areas to define the dichroic function. This enables the possibility of filtering off glare from blue or other regions of the spectrum.

A selective polarizing filter for ophthalmics that employs reflection rather than absorption to generate the selective filtering of light based on incoming polarization state and wavelength.

Although the invention has been described in terms of particular embodiments and applications, one of ordinary skill in the art, in light of this teaching, can generate additional embodiments and modifications without departing from the spirit of or exceeding the scope of the claimed invention. Accordingly, it is to be understood that the drawings and descriptions herein are proffered by way of example to facilitate comprehension of the invention and should not be construed to limit the scope thereof.

What is claimed is:

1. A multi-layer laminate for ophthalmic lenses comprising:
   a thin film layer having a defined level of retardation;
   at least one mesogen coating layer disposed on one side of said retardation thin-film layer; and wherein said laminate exhibits, in a visible region, both a polarization efficiency of greater than 50% and a percentage of luminous transmission of greater than 50% layer.

2. The laminate of claim 1, wherein said at least one mesogen layer is attached to said retardation thin film through an adhesive layer.

3. The laminate of claim 2, wherein said adhesive layer includes a urethane adhesive, an acrylate adhesive or an epoxy adhesive.

4. The laminate of claim 3, wherein a thickness of said adhesive layer is in a range of 0.1 to 5 microns.

5. The laminate of claim 1, wherein said at least one mesogen layer is interposed between two retardation thin films.

6. The laminate of claim 1, wherein a support layer is attached to a side of said at least one mesogen layer opposite to a side said retardation thin film is attached.

7. The laminate of claim 6, wherein said support layer comprises a polycarbonate film or a polyvinyl alcohol film.

8. The laminate of claim 7, wherein said support layer is attached to said side of said at least one mesogen layer through an adhesion layer.

9. The laminate of claim 1, wherein said thin film having said defined level of retardation is in a range of 50-260 nm with a target of 147 nm.

10. The laminate of claim 1, wherein a plurality of mesogen layers are coated onto said retardation thin film.

\* \* \* \* \*